(12) United States Patent  (10) Patent No.: US 6,690,211 B1
Huang et al.  (45) Date of Patent: Feb. 10, 2004

(54) IMPEDANCE MATCHING CIRCUIT

(75) Inventors: Ren-Yuan Huang, Irvine, CA (US);
Yi-Ren Hwang, Hsin-Chu (TW)

(73) Assignee: JMicron Technology Corp., Hsin-Chu (TW)

( * ) Notice: Subject to any disclaimer, the term of this patent is extended or adjusted under 35 U.S.C. 154(b) by 0 days.

(21) Appl. No.: 10/065,907

(22) Filed: Nov. 28, 2002

(51) Int. Cl.⁷ .............................. H03B 1/00; H03K 3/00
(52) U.S. Cl. .................... 327/108; 327/112; 326/30; 326/87
(58) Field of Search .................. 327/108, 111, 327/112, 379, 389, 391; 326/30, 82, 83, 86, 87

(56) References Cited

U.S. PATENT DOCUMENTS

| | | | |
|---|---|---|---|
| 5,134,311 A | 7/1992 | Biber et al. .................. 327/108 |
| 5,606,275 A | * 2/1997 | Farhang et al. .............. 327/108 |
| 5,973,920 A | 10/1999 | Altic et al. .................. 361/687 |
| 6,188,237 B1 | 2/2001 | Hayakawa et al. ........... 326/30 |
| 6,373,300 B2 | 4/2002 | Cardanha et al. ........... 327/112 |
| 6,384,621 B1 | * 5/2002 | Gibbs et al. ................... 326/30 |
| 6,384,714 B2 | 5/2002 | Weber et al. ............. 340/146.2 |
| 6,445,259 B1 | 9/2002 | Weber et al. .............. 333/17.3 |
| 6,448,809 B2 | 9/2002 | Young et al. ................... 326/44 |
| 6,466,487 B1 | 10/2002 | Otsuka ................... 365/189.05 |
| 6,570,402 B2 | * 5/2003 | Koo et al. ..................... 326/30 |
| 6,573,746 B2 | * 6/2003 | Kim et al. ..................... 326/30 |

* cited by examiner

Primary Examiner—Tuan T. Lam
(74) Attorney, Agent, or Firm—Winston Hsu

(57) ABSTRACT

An impedance matching circuit includes a plurality of latch circuits, each connected to one of a plurality of logic circuits. Each latch circuit has a first input commonly connected to a signal line and a second input connected to one of a plurality of non-overlapping digital clock signals. Approximately half of the maximum output resistance is compared with an external resistor and the result latched by a latch circuit corresponding to the most significant bit of the control signal, effectively halving the possible voltage range. A next latch circuit latches the second most significant bit of the control signal similarly, and a third latch circuit latches the remaining bit of the control signal. The control signal controls a binary weighted transistor array that adjusts input voltage. An output signal goes to an output register where it is used to control an output driver.

15 Claims, 4 Drawing Sheets

IMPEDANCE MATCHING CIRCUIT

BACKGROUND OF INVENTION

1. Field of the Invention

The present invention relates to circuits. More specifically, an output buffer or transceiver circuit having a variable impedance output is disclosed.

2. Description of the Prior Art

In integrated circuits, such as microprocessors, memories, transceivers, and the like, signals may be routed for relatively long distances using transmission lines. A transmission line may be a bus, a printed circuit board trace, or another type of relatively long metal line for transporting a signal. Typically, a printed circuit board trace has a characteristic impedance of between 50 and 75 ohms. The receiving end of the far end of the transmission line is typically connected to an input of a logic or receiver circuit where input impedance may not match the characteristic impedance of the transmission line. If this mismatch exists, the signal may be reflected back to the sending end, causing a ringing effect of overshoot and undershoot. This ringing effect degrades noise immunity and increases time for the signal to become, and remain, valid at the far end.

An impedance matching circuit is disclosed in U.S. Pat. No. 5,606,275, included herein by reference, where an external resistor 32 is used and the output impedance is adjusted by converting a sensed voltage level across the external resistor 32 into a digital code using analog-to-digital converters 22 and 24 as shown in FIG. 1. The A/D converters 22 and 24 include comparators 42 and 44 for providing digital signals to binary counters 48 and 51. The binary counters 48 and 51 count up or down in response to the digital signal from the comparators 42 and 44 to adjust a resistance of binary weighted transistor arrays 45 and 46 to match the resistance of the external These binary counters 48 and 51 increase or decrease by 1 least significant bit (LSB) for each cycle, making the period of impedance adjustment too long. A worst-case example using an 8-bit counter of U.S. Pat. No. 5,606,275 would require 2^8 or 256 clock cycles to correctly match the resistance of the external resistor 32.

SUMMARY OF INVENTION

It is therefore a primary objective of the claimed invention to disclose a new counter that can greatly shorten the impedance adjustment process.

Briefly summarized, the claimed invention discloses a selection circuit as a counter that includes a plurality of latch circuits each connected to one of a plurality of logic circuits. Each latch circuit has a first input commonly connected to a signal line IN that indicates whether an input voltage is to be raised or lowered and a second input connected to one of a plurality of non-overlapping digital clock signals.

Each of the logic circuits is structurally different but each logic circuit inputs a latched value of IN from the corresponding latch circuit and at least one of the digital clock signals. The selection circuit outputs a control signal to adjust an input voltage to match a reference voltage using a plurality of first control lines, each first control line indicating one bit in the 3-bit digital control signal.

Initially, the invention selection circuit outputs a code that generates approximately half of the maximum output resistance. If the resistance generated by this code is greater than an external resistor, a value of "0" will be latched by a latch circuit corresponding to the most significant bit of the control signal, otherwise a value of "1" will be latched by the same latch circuit, effectively halving the possible voltage range. At the falling edge of the next digital clock signal, a next latch circuit latches the second most significant bit of the control signal similarly, having again the possible voltage range. A third digital clock signal latches the third most significant bit of the control signal, ending the impedance matching process for that cycle.

The selection circuit of the present invention can easily be extended to function with a control line of N bits by including N latch circuits and N logic circuits. Each successively added logic circuit M (1<M<=N) would comprise an AND operator receiving the latched value from the corresponding latch circuit M and the inverted corresponding digital clock signal CLKM. The result of the AND operator would be inputted into an OR operator that also inputs all of the digital clock signals CLK1 to CLK[M−1]. For example, a fourth logic circuit 280 (not shown) would apply an AND operator to an inverted digital clock signal CLK4 (not shown) and a latched value from a latch circuit 240 (not shown) that receives the signal line IN and the digital clock signal CLK4. The result of the AND operation would be an input into an OR operator along with the digital clock signals CLK1 to CLK3. The result of the OR operation would be outputted via a first control line GI4 (not shown) and would represent the 4th most significant digit in the control signal.

A useful application of the claimed selection circuit is as a replacement for a counter in a buffer circuit. The control signal outputted from the selection circuit controls a binary weighted transistor array that can adjust an input voltage. This adjusted input voltage is compared with a predetermined reference voltage and the result of the comparison is fed to the selection circuit. An output signal from the selection circuit goes to an output register where the output signal is used to control an output driver.

It is an advantage of the claimed invention that the selection circuit can complete the impedance matching process for an 8-bit control signal in only 8 clock cycles, requiring only one clock cycle for each bit in the control signal. This increased speed is evident every time there is more than the smallest impedance mismatching. Furthermore, the claimed selection circuit can be used with existing impedance matching circuits without requiring major redesigning complications or costs.

These and other objectives of the claimed invention will no doubt become obvious to those of ordinary skill in the art after reading the following detailed description of the preferred embodiment, which is illustrated in the various figures and drawings.

DETAILED DESCRIPTION

A conventional binary counter increases or decreases by one least significant bit for each clock cycle. Using a 3-bit counter as an example, it is possible to take as many as 2^3 or 8 clock cycles to complete the impedance adjustment process. The present invention discloses a new counter, or selection circuit, that can complete the same adjustment process in 3 clock cycles.

Figure 3:
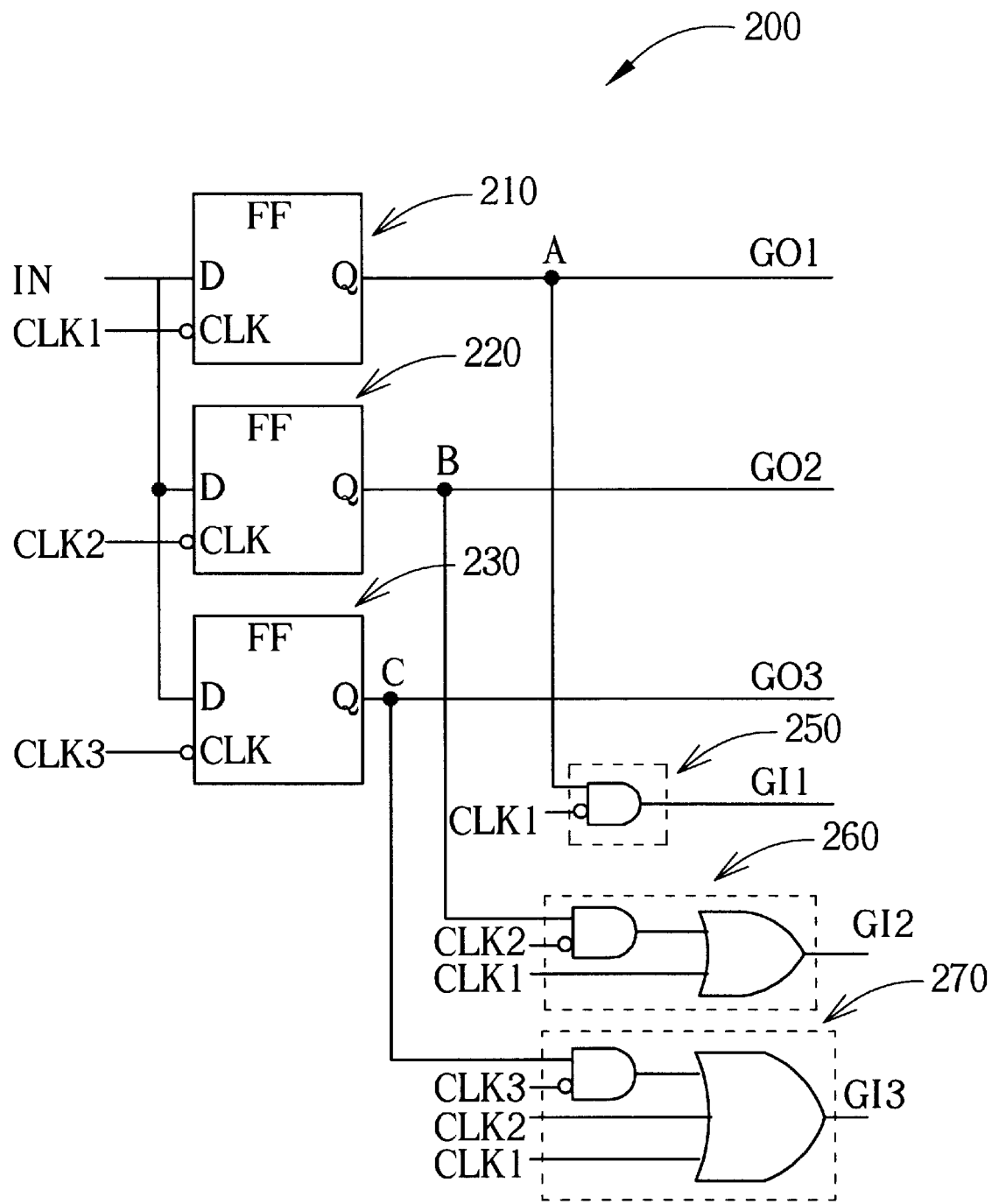
FIG. 3 is a diagram of the selection circuit of FIG. 2

Please refer to FIG. 3, which is a diagram of a selection circuit 200 according to the present invention. The disclosed selection circuit 200 comprises a plurality of latch circuits 210, 220 and 230, each of which is respectively connected to one of a plurality of logic circuits 250, 260 and 270. Although the shown example comprises 3 latch circuits 210, 220, 230, and 3 logic circuits 250, 260, 270, the present invention is not limited to this quantity and can comprise other quantities of latch circuits 210, 220, 230, and appropriately designed and configured logic circuits 250, 260, 270 without departing from the teachings of the present invention.

Each latch circuit 210, 220, 230 has a first input commonly connected to a signal line IN that indicates whether an input voltage is to be raised or lowered, and a second input connected to a source of a digital clock signal. Each latch circuit 210, 220, 230 is respectively connected to a different one of a plurality of digital clock signals CLK1, CLK2, CLK3. The digital clock signals CLK1, CLK2, and CLK3 are non-overlapping, meaning that at most one of the plurality of digital clock signals CLK1, CLK2, and CLK3 is high at any given time. That is, at most one of CLK1, CLK2, CLK3 signals is active, or makes an active edge transition. In the following, a falling edge of the clock signal is an active signal, and so only one falling edge occurs at any given time for the clocks CLK1, CLK2, CLK3. Example waveforms of the digital clock signals CLK1, CLK2, and CLK3 can be seen in FIG. 4. Each latch circuit 210, 220, 230 is triggered by the falling edge of the respectively inputted digital clock signal CLK1, CLK2, CLK3 and latches the current value of IN, outputting that latched value to Nodes A, B, or C until the next falling edge of the digital clock signal is inputted. The Nodes A, B, and C are each respectively connected to one of the logic circuits 250, 260, and 270, and are also connected to one second control line GO1, GO2, or GO3 for output.

As can be easily seen in FIG. 3, each of the logic circuits 250, 260, and 270 is structurally different, but each logic circuit 250, 260, and 270 inputs the latched value of IN from the corresponding Node A, B, or C and at least one of the digital clock signals CLK1, CLK2, and CLK3. The selection circuit 200 outputs a control signal to adjust an input voltage to match a reference voltage. The control signal comprises a plurality of first control lines GI1, GI2, and GI3, each first control line GI1, GI2, GI3 indicating one bit in the digital control signal. Each logic circuit 250, 260, and 270 respectively outputs the corresponding bit GI1, GI2, GI3 of the control signal.

The logic circuit 250 comprises an AND operator, with one input of the AND operator receiving the value at the Node A (and latched in the latch circuit 210) and another input of the AND operator receiving the inverted digital clock signal CLK1 (the same CLK1 that is also supplied to the latch circuit 210). The result of the AND operation is outputted to the first control line GI1 and represents the most significant bit GI1 of the control signal.

The logic circuit 260 comprises an AND operator, with one input of the AND operator receiving the value at the Node B and another input of the AND operator receiving the inverted digital clock signal CLK2. The logic circuit 260 additionally comprises an OR operator that provides another input for receiving the digital clock signal CLK1. One input of the OR operator receives the output of the AND operator, and the other input of the OR operator receives the digital clock signal CLK1. The result of the OR operation is outputted to the first control line GI2, and represents the second most significant bit of the control signal.

The logic circuit 270 comprises an AND operator, with one input of the AND operator receiving the value at the Node C and another input of the AND operator receiving the inverted digital clock signal CLK3. The logic circuit additionally comprises an OR operator, which provides another input for receiving the digital clock signal CLK1, and yet another input for receiving the digital clock signal CLK2. One input of the OR operator receives the output of the AND operator, another input of the OR operator receives the digital clock signal CLK1, and a third input of the OR operator receives the digital clock signal CLK2. The result of the OR operation is outputted to the first control line GI3 and represents the third most significant bit of the control signal (i.e., the least significant bit of the control signal).

As previously stated, the selection circuit of the present invention can easily be extended to function with a control line of N bits by including N latch circuits and N logic circuits. Each successively added logic circuit M (1<M<=N) would comprise an AND operator receiving the latched value from the corresponding latch circuit M and the inverted corresponding digital clock signal CLKM. The result of the AND operator would be inputted into an OR operator that also inputs all of the digital clock signals CLK1 to CLK[M−1]. For example, a fourth logic circuit 280 (not shown) would apply an AND operator to an inverted digital clock signal CLK4 (not shown) and a latched value from a latch circuit 240 (not shown) that receives the signal line IN and the digital clock signal CLK4. The result of the AND operation would be an input into an OR operator along with the digital clock signals CLK1 to CLK3. The result of the OR operation would be outputted via a first control line GI4 (not shown) and would represent the 4th most significant digit in the control signal. Additionally, although the above-described logic circuits 250, 260, and 270 are implemented using AND and OR operators, it is obvious that other combinations of logical operators can be used to achieve the same outputted results and such other combinations of logical operators also falls within the scope of the present invention.

Figure 4:
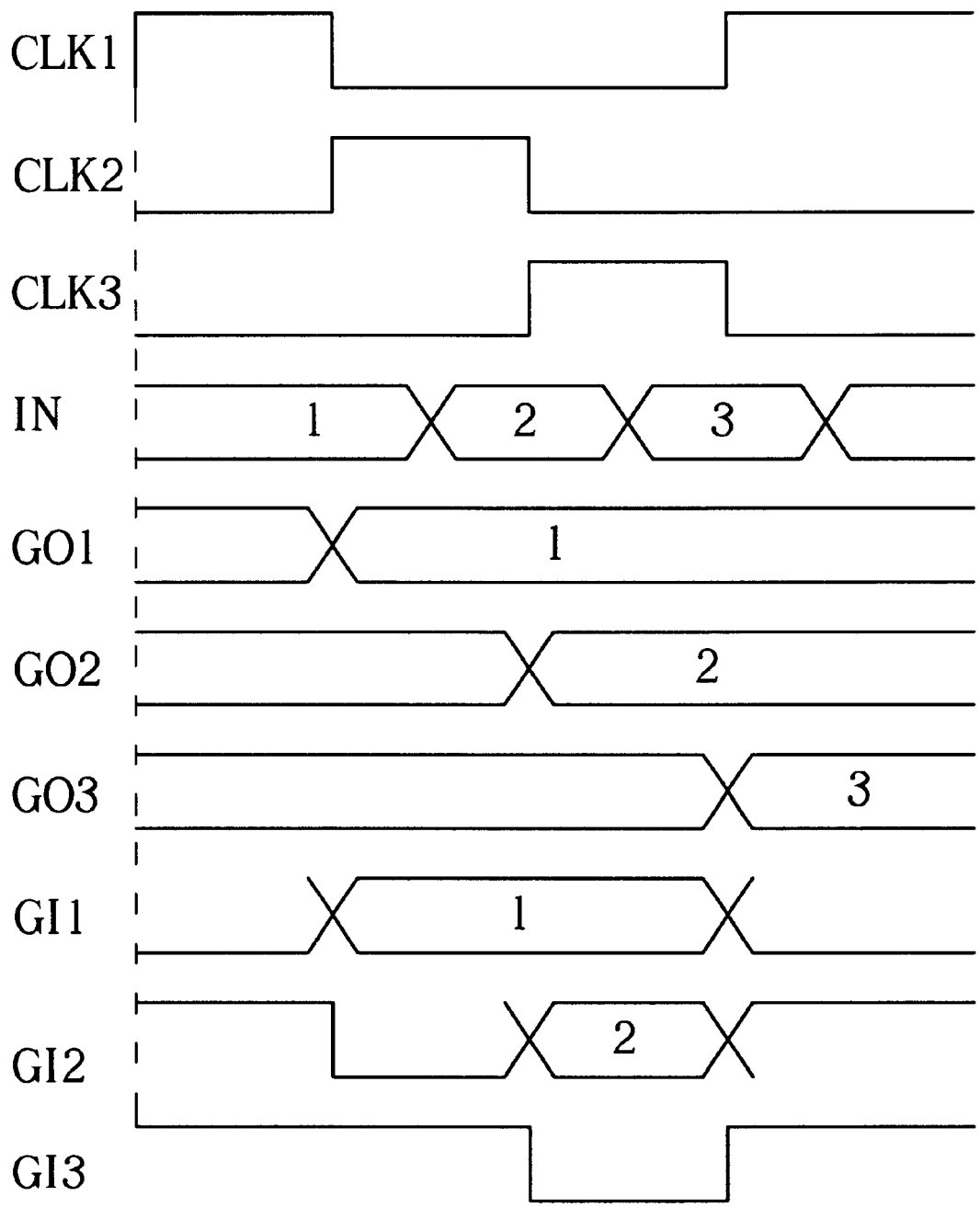
FIG. 4 is a waveform diagram illustrating the operation of the present invention.

Referring now to FIG. 3 and the waveforms shown in FIG. 4, the operation of the present invention will be detailed. As discussed above, the three digital clock signals CLK1, CLK2, and CLK3 are non-overlapping. In this preferred embodiment of the present invention, when the signal IN indicating if the input voltage is to be raised or lowered (IN) is high, a raise in voltage is indicated, although another embodiment of the present invention uses a low signal IN to indicate a raise in voltage. Additionally, the preferred embodiment of the present invention puts the control signal initially supplied to the binary weighted transistor array by the first control lines GI1, GI2, and GI3 at "011". While other initial values can be used in other embodiments, an initial value near the mid-point of the voltage range is preferred, and more specifically, just beneath the mid-point of the voltage range gives the best results.

Initially, the digital clock signal CLK1 is high and the digital clock signals CLK2 and CLK3 are low. This condition outputs a control signal "011", or indicating a roughly mid-range voltage, on the first control lines GI1, GI2, and GI3. The mid-range voltage obviously generates approximately half of the maximum output resistance. If the resistance generated by this code is greater than an external resistor, the resulting IN will be low otherwise IN will be high. In this example, a desired resistance is provided when an output signal comprising the second control lines GO1, GO2, and GO3 outputs the code "100" (with GO1 outputting the most significant bit, GO2 outputting the second most significant bit, and GO3 outputting the third most significant bit. Because the desired output signal ("100") is greater than the control signal ("011") (code outputted by the first control lines GI1, GI2, and GI3 is the control signal), the signal IN becomes high.

At the falling edge of the digital clock signal CLK1, the signal IN is high, is latched by the latch circuit 210, and is outputted to the second control line GO1 and to the first control line GI1 via the logic circuit 250. At about the same time, the digital clock signal CLK2 becomes high. As can be seen in FIG. 3, this condition outputs a control signal of "101" via the first control lines GI1, GI2, and GI3 and an output signal of "100" via the second control lines GO1, GO2, and GO3. This time, the desired output signal ("100") is not greater than the control signal ("101") and the signal IN becomes low.

At the falling edge of the digital clock signal CLK2, the signal IN is low, is latched by the latch circuit 220, and is outputted to the second control line GO2 and to the first control line GI2 via the logic circuit 260. At about the same time, the digital clock signal CLK3 becomes high. This condition (Node A is high, Node B is low, and CLK3 is high) outputs a control signal of "100" via the first control lines GI1, GI2, and GI3 and an output signal of "100" via the second control lines GO1 , GO2, and GO3. Again, the desired output signal ("100") is not greater than the control signal ("100") thus the signal IN remains low.

At the falling edge of the digital clock signal CLK3, the signal IN is low, is latched by the latch circuit 230, and is outputted to the second control line GO3 and to the first control line GI3 via the logic circuit 270. At about the same time, the digital clock signal CLK1 becomes high again. This condition (Node A is still high, Node B is still low, Node C is low, and CLK1 is high) outputs a control signal of "011" and an output signal of "100". Now, the desired output signal ("100") is again greater than the control signal ("011") and the signal IN becomes high again.

At this point, all three bits in the output signal have been correctly latched as "100". Also, the current condition of an output signal of "100" and a control signal of "011" matches the initial condition when the digital clock signal CLK1 was high the first time. Therefore, three-step cycle of latching the most significant bit of the output signal first, latching the second most significant bit of the output signal second, and latching the third most significant bit third will repeat as can be seen in Table 1.

TABLE 1

| Target Output = "100" | | | | Output Signal | | | Control Signal | | | Target > Control? |
|---|---|---|---|---|---|---|---|---|---|---|
| | | | | GO1 Node | GO2 Node | GO3 Node | | | | |
| IN | Clk1 | Clk2 | Clk3 | A | B | C | GI1 | GI2 | GI3 | 1 Else 0 |
|  | 1 | 0 | 0 |  |  |  | 0 | 1 | 1 | 1 |
| 1 | 0 | 1 | 0 | 1 | 0 | 0 | 1 | 0 | 1 | 0 |
| 0 | 0 | 0 | 1 | 1 | 0 | 0 | 1 | 0 | 0 | 0 |
| 0 | 1 | 0 | 0 | 1 | 0 | 0 | 0 | 1 | 1 | 1 |
| 1 | 0 | 1 | 0 | 1 | 0 | 0 | 1 | 0 | 1 | 0 |
| 0 | 0 | 0 | 1 | 1 | 0 | 0 | 1 | 0 | 0 | 0 |
| 0 | 1 | 0 | 0 | 1 | 0 | 0 | 0 | 1 | 1 | 1 |

Figure 1:
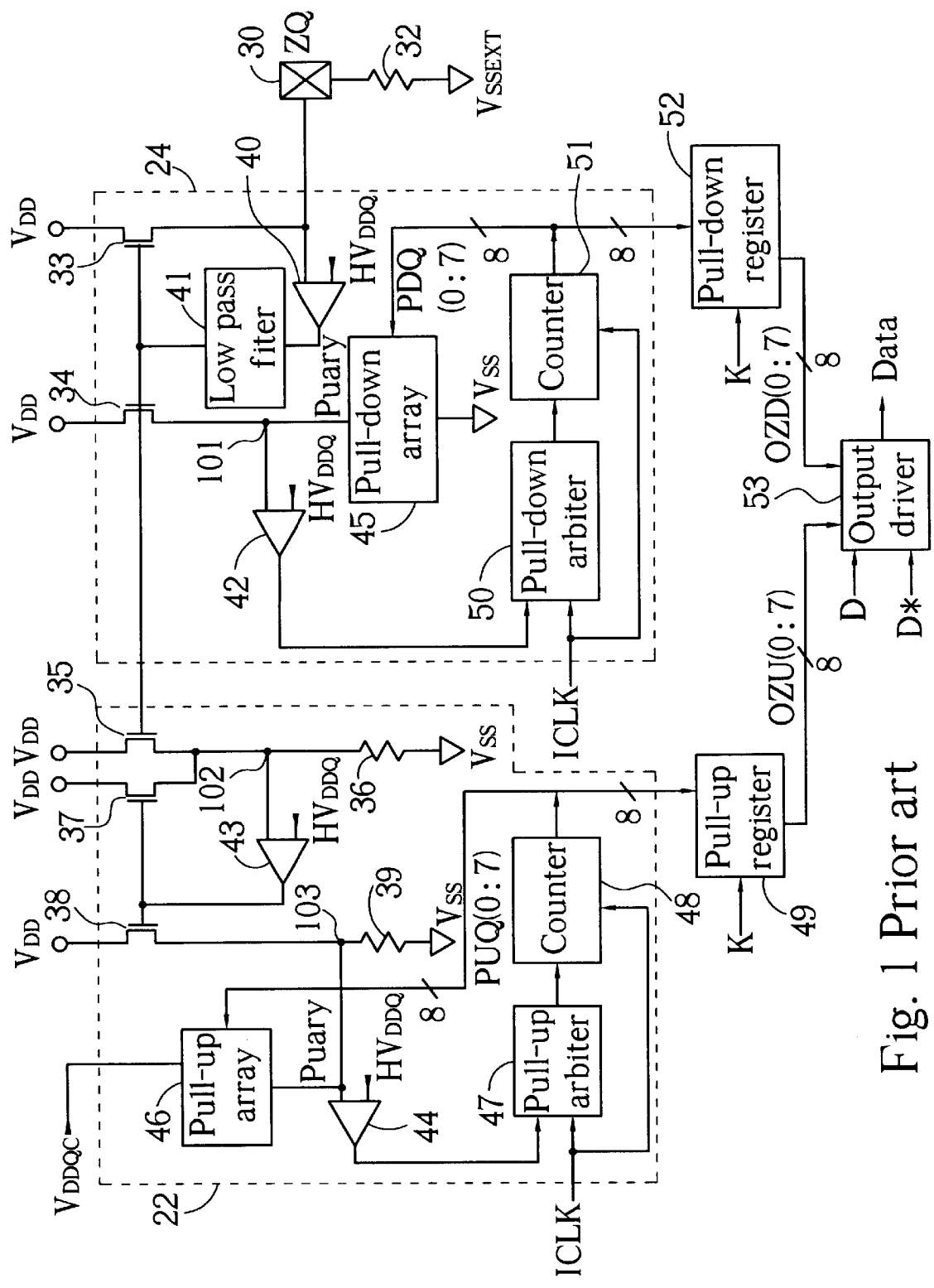
FIG. 1 is a diagram of a buffer circuit having variable output impedance according to a prior art.
Figure 2:
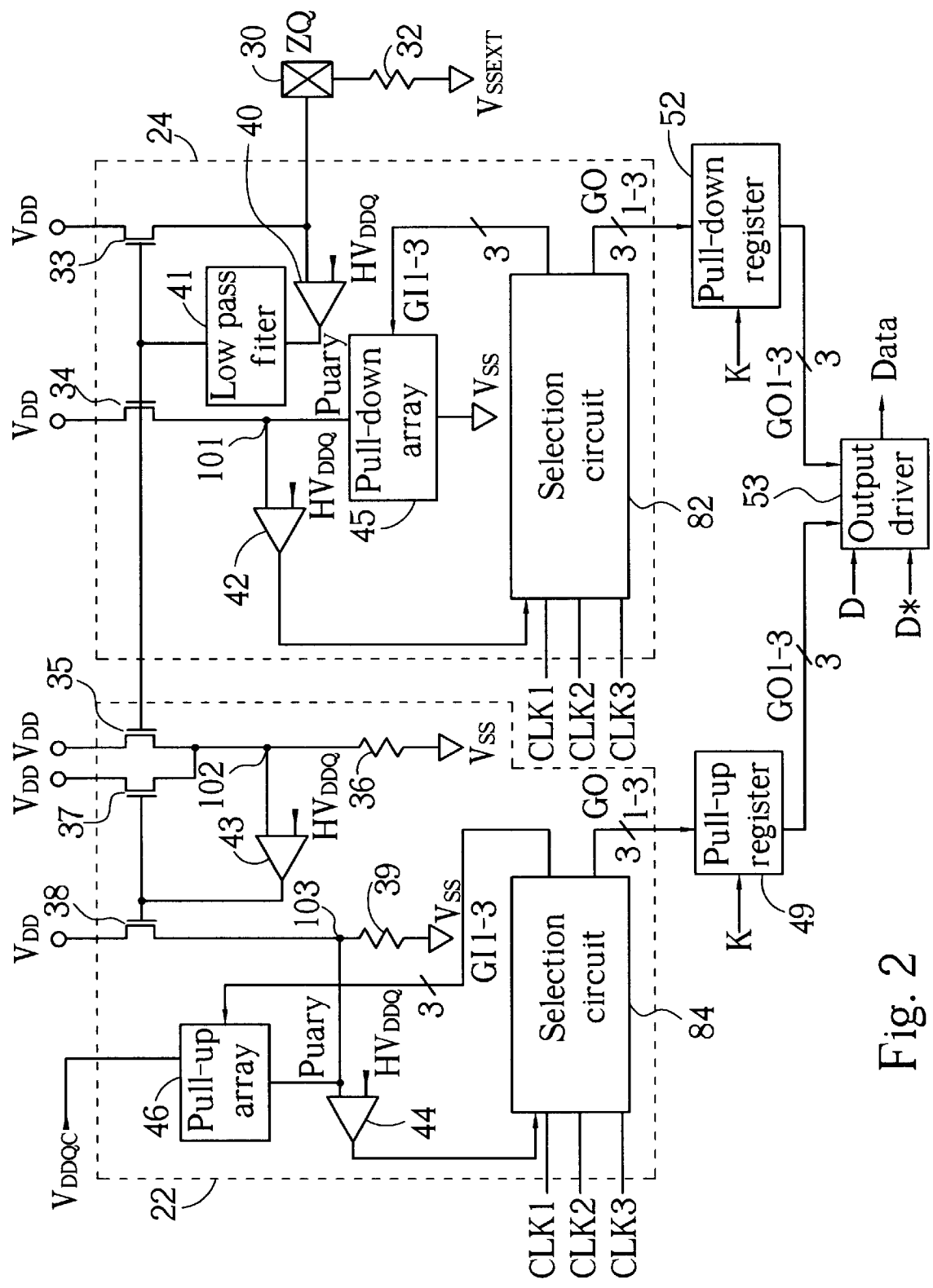
FIG. 2 is a diagram of a buffer circuit having variable output impedance according to the present invention.

One useful application of the present invention selection circuit 200 is as a replacement for a pull-down arbiter 50 and a counter 51 in a prior art buffer circuit such as shown in FIG. 1. FIG. 2 shows such a circuit. In FIG. 2, the control signal outputted from the selection circuit 82 or 84 controls a binary weighted transistor array 45 and 46 that can adjust an input voltage. This adjusted input voltage is compared with a predetermined reference voltage HVDDQ in a comparator 42 and 44 and the result of the comparison is fed to the selection circuit 82 and 84 as the IN input. The output signal from the selection circuit 82 and 84 goes to the output registers 49 and 52 where they are used to control the output driver 53.

As previously stated, a worse case scenario for the prior art counter 48 and 51 requires 2^8 or 256 clock cycles to complete the impedance matching process. Using the same 8-bit control signal as the prior art, the present invention selection circuits 82 and 84 can complete the impedance matching process in only 8 clock cycles, requiring only one clock cycle for each bit in the control signal, a vast improvement. This increased speed is evident every time there is more than the smallest impedance mismatching. Furthermore, the selection circuits 82 and 84 can be used with existing impedance matching circuits without requiring major redesigning complications or costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An impedance matching circuit having an output register, the impedance matching circuit comprising:
   a binary weighted transistor array;
   a comparator comprising a first input connected to an output of the binary weighted transistor array and a second input connected to a predetermined reference voltage;
   a plurality of latch circuits, each latch circuit comprising a first input connected to an output of the comparator and a second input connected to one of a plurality of non-overlapping digital clock signals;
   a plurality of first control lines, each first control line connecting an output of one latch circuit and one input of the binary weighted transistor array; and
   a plurality of second control lines, each second control line uniquely connecting the output of one latch circuit and an input of the output register.

2. The impedance matching circuit of claim 1 wherein each first control line comprises a predefined logic circuit for adjusting a magnitude of an input voltage until the input voltage is approximately equal to the predetermined reference voltage.

3. The impedance matching circuit of claim 2 wherein each predefined logic circuit comprises an output for outputting a binary result of that predefined logic circuit to the binary weighted transistor array and a plurality of inputs for inputting the output of one latch circuit and for inputting at least one of the non-overlapping digital clock signals.

4. The impedance matching circuit of claim 3 wherein the binary weighted transistor array outputs to the comparator a predetermined voltage according to the binary results outputted from the predefined logic circuits.

5. The impedance matching circuit of claim 1 wherein the output of the comparator is latched by each latch circuit according to an active edge of the non-overlapping digital clock signal inputted into that latch circuit.

6. The impedance matching circuit of claim 5 wherein each second control line uniquely sets one bit in the output register.

7. A method for matching impedance in an output buffer comprising:

comparing an input voltage to a predetermined reference voltage and outputting a comparison result;

latching the comparison result in a plurality of latch circuits according to a plurality of non-overlapping digital clock signals, each non-overlapping digital clock signal uniquely corresponding to one latch circuit;

using a second control signal outputted from each latch circuit to set one corresponding bit in an output register; and logically combining a first control signal outputted from each latch circuit with at least one of the non-overlapping digital clock signals to adjust a magnitude of the input voltage.

8. The method of claim 7 wherein the first control signal from each latch circuit is independently logically combined with at least one of the non-overlapping digital clock signals in a corresponding predefined logic circuit and the result of the combination is outputted to a binary weighted transistor array.

9. The method of claim 8 wherein the binary weighted transistor array uses the results outputted from the predefined logic circuits to adjust the magnitude of the input voltage.

10. The method of claim 9 wherein the magnitude of the input voltage is initially initialized to be less than one-half of the maximum input voltage.

11. A selection circuit for matching an input voltage adjusted by a binary weighted transistor array to a reference voltage, the binary weighted transistor array controlled by a control signal provided by a plurality of control lines, each control line indicating one bit in the control signal, the selection circuit comprising:

a plurality of latch circuits, each latch circuit comprising a first input for receiving a signal indicating when the input voltage is to be raised or lowered, a second input for receiving one of a plurality of non-overlapping digital clock signals, and an output; and a plurality of logic circuits, each logic circuit inputting the output of one corresponding latch circuit and at least one of the non-overlapping digital clock signals, each logic circuit outputting to one control line.

12. The selection circuit of claim 11 wherein a first latch circuit inputs a first non-overlapping digital clock signal, a first logic circuit inputs the output of the first latch circuit and the first non-overlapping digital clock signal, and the first logic circuit outputs a most significant bit of the control signal.

13. The selection circuit of claim 12 wherein when the output of the first latch circuit is a first value and the first non-overlapping digital clock signal is not the first value, the first logic circuit outputs the first value as a control signal.

14. The selection circuit of claim 12 wherein a second latch circuit inputs a second non-overlapping digital clock signal, a second logic circuit inputs the output of the second latch circuit and the first and second non-overlapping digital clock signals, and the second logic circuit outputs a second most significant bit of the control signal.

15. The selection circuit of claim 14 wherein a third latch circuit inputs a third non-overlapping digital clock signal, a third logic circuit inputs the output of the third latch circuit and the first, second, and third non-overlapping digital clock signals, and third first logic circuit outputs a third most significant bit of the control signal.

* * * * *